United States Patent [19]
Saraf et al.

[11] Patent Number: 5,866,044
[45] Date of Patent: Feb. 2, 1999

[54] LEAD FREE CONDUCTIVE COMPOSITES FOR ELECTRICAL INTERCONNECTIONS

[75] Inventors: Ravi F. Saraf, Briarcliff Manor; Judith Marie Roldan, Ossining; Michael Anthony Gaynes, Vestal, all of N.Y.; Richard Benton Booth, Pfugerville, Tex.; Steven Paul Ostrander, Scotia, N.Y.; Emanuel I. Cooper, Riverdale, N.Y.; Carlos J. Sambucetti, Croton-on-Hudson, N.Y.

[73] Assignee: International Business Machines, Armonk, N.Y.

[21] Appl. No.: 734,492

[22] Filed: Oct. 21, 1996

Related U.S. Application Data

[63] Continuation of Ser. No. 339,609, Nov. 15, 1994, abandoned.

[51] Int. Cl.⁶ ............................... H01B 1/12; H01B 1/22
[52] U.S. Cl. ................ 252/519.31; 252/512; 252/514; 252/518; 252/519.32; 252/519.33; 106/1.13; 106/1.15; 106/1.21
[58] Field of Search ................... 252/512, 514, 252/518, 519.31, 519.32, 519.33; 106/1.13, 1.15, 1.21

[56] References Cited

U.S. PATENT DOCUMENTS

| | | | |
|---|---|---|---|
| 4,022,649 | 5/1977 | Nakagome et al. | 156/309 |
| 4,545,926 | 10/1985 | Fouts, Jr. et al. | 252/511 |
| 4,574,056 | 3/1986 | Kimura | 252/514 |
| 4,595,605 | 6/1986 | Martin et al. | 427/96 |
| 4,822,523 | 4/1989 | Prud'Homme | 252/511 |
| 4,916,009 | 4/1990 | Hino et al. | 428/220 |
| 5,062,896 | 11/1991 | Huang et al. | 106/287.19 |
| 5,086,558 | 2/1992 | Grube et al. | 29/232 |
| 5,091,114 | 2/1992 | Nakajima et al. | 252/514 |
| 5,120,573 | 6/1992 | Miyazaki et al. | 427/96 |
| 5,158,708 | 10/1992 | Yamamoto et al. | 252/512 |
| 5,209,873 | 5/1993 | Yamamoto et al. | 252/512 |
| 5,270,371 | 12/1993 | Cole et al. | 524/359 |
| 5,376,403 | 12/1994 | Capote et al. | 427/96 |
| 5,378,533 | 1/1995 | Ota | 428/304 |
| 5,433,893 | 7/1995 | Jost et al. | 252/514 |

FOREIGN PATENT DOCUMENTS

| | | |
|---|---|---|
| 0 269 567 | 6/1988 | European Pat. Off. . |
| 0 330 113 | 8/1989 | European Pat. Off. . |
| 0 443 841 A2 | 8/1991 | European Pat. Off. . |
| 3804831 C1 | 7/1989 | Germany . |
| 2 277 526 | 11/1994 | United Kingdom . |
| WO 95/04786 | 2/1995 | WIPO . |

OTHER PUBLICATIONS

Saraf, et al. "Polymer/Metal Composite for Interconnection Technology", 45th Electronic Components and Technology Conference May 21–May 24, 1995, pp. 1051–1053.
Japan Abstract No. 87–133469.
Japan Abstract Publication No. JP63117075 May 21, 1988.

*Primary Examiner*—Paul Lieberman
*Assistant Examiner*—Gregory R. Delcotto
*Attorney, Agent, or Firm*—Scully, Scott, Murphy & Presser

[57] ABSTRACT

An electrically conductive paste which includes a thermoplastic polymer, a conductive metal powder and an organic solvent system is disclosed. The invention further encompasses an electrically conductive composite which includes the aforementioned thermoplastic and metal, wherein the metal represents at least about 30% by volume, based on the total volume of the composite. The composite is formed from the paste under elevated temperature. The paste is employed in processes which involve electrically connecting electrical and electronic components under process conditions which convert the paste to the composite.

4 Claims, 1 Drawing Sheet

LEAD FREE CONDUCTIVE COMPOSITES FOR ELECTRICAL INTERCONNECTIONS

This application is continuation, of application Ser. No. 08/339,609 filed Nov. 15, 1994, now abandoned.

FIELD OF THE INVENTION

The present invention is directed to an electrically conductive paste useful in forming electroconductive connections between electroconductive members. The invention is further directed to a method of forming electroconductive connections between electroconductive members utilizing the aforementioned electrically conductive paste.

BACKGROUND OF THE INVENTION

Electrically conductive compositions for forming electroconductive connections between conductive members, i.e., termination pads on a chip and pads associated with circuits printed on a circuit board, are well known in the art. Indeed, conventional solder compositions which comprise eutectic alloys, such as lead-tin alloys, have long been known in the art. Such materials, however, require the inclusion of a flux composition to remove oxides resident on the surface of the solder metals. These flux materials which are acidic in nature, are corrosive to the highly valuable electrical components that are so electrically connected, and are usually removed by the use of solvents. However, traditional flux removal solvents, such as CFCs, are environmentally objectionable and their use complicates the manufacturing procedures wherein flux materials are utilized. Thus, flux materials find less and less application in electrical assemblies requiring the connection of expensive electrical components used in modern electrical and electronic devices such as computers and the like.

New electrically conductive pastes have been developed in view of this known disadvantage of eutectic alloys. Typically, these pastes comprise electrically conductive metal powders and a thermosetting resin material. Such materials are applied to the electrical components then heated to form an electrical connection. During that heating the thermosetting resin cures. Although it is known to utilize a nonoxidizing metal as the electrically conductive powder in these new pastes, thus avoiding the necessity of utilizing a flux, such materials are characterized by the disadvantageous property of not being remeltable. Those skilled in the art are aware that upon curing of a thermosetting resin, a crosslinked structure is formed. Polymers having a crosslinked structure cannot be remelted or dissolved. Thus, such electrically connected components, which can be quite expensive, cannot be easily disconnected and reconnected, when necessary, by merely heating or redissolving the conductive paste to disconnect the components and thereafter reconnecting them using the previously used or fresh identical paste.

A recent development, which provides a significant advance in the art, is described in U.S. Pat. No. 5,062,896 which is incorporated herein by reference. The '896 patent is directed to a composite poly-mersolder paste which included a eutectic metal alloy powder filler, said alloy having a melting point below 200° C., present in a concentration of about 85% to 93% by weight, based on the total weight of the paste.

The paste composition of the '896 patent included, as a second component, a thermoplastic polymer. It is the presence of that thermoplastic polymer which represents the advance in the art provided by this patent. The thermoplastic polymer of the paste of the '896 patent permits remelting of the paste. As those skilled in the art are aware, a thermoplastic polymer does not cure into a three-dimensional network. Rather, the thermoplastic polymer, which in the '896 patent is preferably a poly(imide siloxane), because it essentially does not crosslink, can be remelted or redissolved.

A third component included in the paste of the '896 patent is a volatile organic solvent having a boiling point above the melting point of the alloy powder but below the maximum reflow temperature of the composite paste composition.

Finally, a fourth and last essential component of the '896 composite paste is a transient flux material which is an aliphatic monocarboxylic acid having a boiling point between about 140° C. and 200° C. It is noted, however, that an aromatic monocarboxylic acid, such as 2-methoxybenzoic acid, may also be utilized. The flux material is generally present in an amount of between about 0.5% and 1.5% by weight.

Although the paste composition of the '896 patent, which may include optional components such as surfactants and the like, represents a significant advance in the art, solving as it does the problem associated with remelting of metal powder-polymer composites, does not overcome the other major problem associated with the materials of the prior art. That is, the problem associated with acidic fluids, which evolve from the fourth essential transient flux material and have a detrimental corrosive effect upon the expensive electronic components which are electrically connected by the paste, is unaddressed.

A flux component must be included in the paste of the '896 patent because of the inclusion therein of oxidizable metals, as made clear by the use therein of metals having a melting point of less than 200° C. As such, the advance in the art provided by the paste of the '1896 patent does not address all the problems associated with the electrically conductive interconnecting materials of the prior art.

SUMMARY OF THE INVENTION

A new electrically conductive paste has now been developed which overcomes the problems associated with electroconductive compositions of the prior art used to electrically connect electroconductive members. Thus, the electroconductive paste of the present application not only permits remelting of the paste but, in addition, solves the problems associated with acidic fluxes by eliminating a flux material therein.

In accordance with the present invention, an electrically conductive paste is provided. The paste includes a thermoplastic polymer, a conducting metal powder, and an organic solvent system.

In further accordance with the present invention, an electrically conductive composite is described. The composite comprises at least 30% by volume, based on the total volume of the composite, of a conducting metal powder.

In still further accordance with the present invention, a method of circuitizing a flexible substrate to create a flexible circuit is provided. In this method, electronic components, such as integrated chips and surface mount devices, are bonded to a flexible substrate by means of the conductive paste of the present invention. The paste, under the influence of heat, is converted into the conductive composite of the instant invention.

In yet still further accordance with the present invention, a method of interconnecting multilayered structures, alternately described as multichip module laminates, is taught. In this method, multilayered structures, which may be thermoplastic, e.g., a polyamide, are electrically interconnected by means of vias, i.e., through holes or blind holes, from pairs of multilayered structures which are fused together under appropriate heat and pressure utilizing the conductive paste of the present application.

In even further accordance with the present invention, a method of surface mounting an integrated circuit (IC) chip in a lead-frame to a circuit board is disclosed. In this method, the electrically conductive leads of the lead-frame or a surface mount device, such as a capacitor or a resistor, are electrically connected to pads of a circuit board by means of the paste composition of the present invention which is thereupon converted to the conductive composite under the application of heat.

In final accordance with the present invention, a method of directly bonding a bare integrated circuit chip to a circuit board is set forth. In this method a bare integrated chip is disposed, in upside down configuration, such that its terminal I/O pads contact conductive pads on the surface of a circuit board. An effective amount of the paste of the present invention is placed between the I/O pads of the chip and the conductive pads of the circuit board. The paste is heated to form an electrically conductive composite thus forming an electrically conductive path between the chip and the circuit board.

BRIEF DESCRIPTION OF THE DRAWINGS

The above-described invention may be better understood with reference to the accompanying drawings of which.

DETAILED DESCRIPTION OF THE INVENTION

Figure 1:
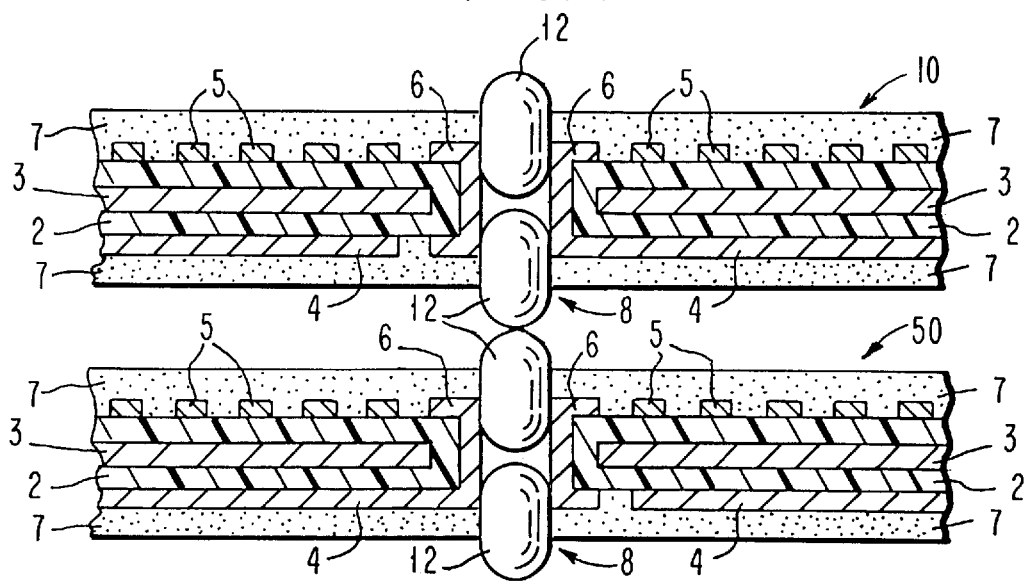
FIG. 1 is a cross-sectional view demonstrating the use of the paste and composite of the present invention to achieve via to via interconnection between two layers containing circuitry.

The electrically conductive paste of the present invention is a composition which includes three components. The first of these components is a thermoplastic polymer. This polymer may be, for example, selected from the group consisting of a thermoplastic polymer having a repeating structural formula which includes at least one moiety selected from the group consisting of sulfur, oxygen, nitrogen, silicon, alkyl and phenyl. The repeating structural unit of the thermoplastic polymer of the conductive paste may include more than one of the moieties recited above.

The thermoplastic polymer may be a homopolymer, that is, a single monomeric repeating polymer, or a segmented copolymer or a segmented copolymer having at least three different homopolymer segments and mixtures thereof. Segmented copolymers within the contemplation of the thermoplastic polymer of the present invention include those containing at least two comonomers which are provided in segmented form. Comonomers provided in segmented form are copolymers which include blocks of a repeating monomeric unit of a first monomer adjacent to a repeating monomeric unit of at least one different monomer which may have the same or different lengths which can vary from one monomer unit to many monomer units. Preferably, the segmented copolymer of the present invention includes soft and hard repeating monomeric blocks formed of non-polar and polar units, respectively.

Among the preferred homopolymers within the contemplation of the thermoplastic polymer of the conductive paste of the present invention are polysulfones, polyolefins, and polyacrylates.

Segmented copolymers within the contemplation of the present invention include such copolymers as poly(imide ureas), poly(ether siloxanes), poly(imide siloxanes), poly (styrene butadienes), poly(styrene isoprenes), poly (acrylonitrile butadienes), polyurethanes, and poly(ethylene vinyl acetates).

Many of the preferred segmented copolymers mentioned in the previous paragraph are thermoplastic elastomers. Such polymers combine the advantageous properties of thermoplastics and elastomers without the attendant disadvantages thereof. That is, thermoplastic elastomers, unlike classical elastomers, can be remelted and reshaped. Similarly, unlike classical thermoplastics, thermoplastic elastomers have the ability to be stretched with good elastic recovery.

All the thermoplastic polymers employable as a component of the electrically conductive paste share the requirement that they have good thermal stability. To that end, it is preferable that the thermoplastic polymeric component have a decomposition temperature of at least about 200° C. More preferably, the thermoplastic decomposition temperature is at least about 300° C.

A second component of the conductive paste of the present invention is a conductive metal powder. Preferably, this conductive metal powder is an oxide-free powdered metal typically having a melting point of at least about 200° C. The term "oxide-free" means either that the metal does not form an oxide or that the metal does form an oxide but that oxide does not appreciably act as an insulator of electrical conductivity. Thus, such metals as gold, silver, tin, nickel, ruthenium, rhodium, palladium, platinum and iridium are preferred for use as the "oxide-free" metal. The oxide-free metal may be provided by an oxide-free metal element, by an alloy of at least two oxide-free metal elements or by a metal with no surface oxide coated with either a single oxide-free metal element or by an alloy of at least two oxide-free metal elements. "Powder" means particles generally less than 50μ in diameter, or major dimension, whether as a single particle or as an aggregate of smaller particles.

It is more preferred that the oxide-free metal, employed alone or in an alloy, in the pure form or as a coating, be silver or gold.

Those skilled in the art will appreciate that a diffusion barrier layer may be required to prevent some oxide-free metals from diffusing into an oxidizable metal core. For example, cobalt, preferably an alloy of cobalt and phosphorus, is oftentimes added to the surface of a copper core prior to the coating thereon of gold. This prevents diffusion of any gold coating, at elevated temperature, into the copper.

The second component, although less preferable to the oxide-free metal discussed above, can also be a composite having a core of, for example, an organic polymer or an inorganic material, coated with an oxide-free metal.

In such an embodiment, where the core is an organic polymeric material, the organic polymer is preferably polystyrene latex spherical particles.

In still another embodiment, where the core is an inorganic material, the inorganic material is a powdered solid in the form of an oxide, such as silica, alumina, zirconia or titania, a borate, a titanate, a silicate, a carbide, a nitride or other ceramic material.

It is preferable that the conductive metal powder have an average size no larger than about 20 microns. More preferably, the average size of the metal powder employed in the conductive paste of the present application is no larger than about 10 microns. Still more preferably, the average size of the metal powder is no greater than about 5 microns.

The third component of the conductive paste of the present application is an organic solvent system preferably one having at least one polar organic solvent. Preferably, the polar organic solvent utilized in the conductive paste of the present invention is one having a boiling point, at atmospheric pressure, in the range of between about 130° C. and about 300° C. More preferably, the boiling point, at atmospheric pressure, of the polar organic solvent is in the range of between about 150° C. and about 250° C.

Polar solvents which meet the above criterion may nonexclusively be esters, ethers, amides, lactones or sulfones. Thus, such esters as dimethyl adipate and ethyl benzoate; ethers like acetophenone and 2-methoxyethyl ether; amides including dimethyl acetamide; lactones encompassing N-methyl pyrrolidinone; and sulfones exemplified by dimethyl sulfoxide are within the scope of the polar solvent useful in the paste of the instant invention.

It should be appreciated that although the paste of the present invention preferably includes at least one polar organic solvent, preferably one of the aforementioned polar solvents, it may include more than one of those solvents. That is, the solvent may be a mixture of two or more polar organic solvents. It may also include not only one or more polar organic solvents but, in addition, one or more non-polar solvents.

In the preferred embodiment wherein an organic non-polar organic solvent is employed in combination with at least one polar solvent, it is preferred that the non-polar organic solvent be a liquid hydrocarbon. More preferably, a liquid aromatic hydrocarbon is utilized. Among the preferred aromatic hydrocarbons preferred for use in the paste of the present invention, as part of a polar solvent composition, are xylene and trimethylbenzene.

The electrically conductive paste may, optionally, include additional components such as corrosion inhibitors, surfactants and the like. However, it is emphasized that the conductive paste does not include any flux material.

A second aspect of the present invention is directed to an electrically conductive composite. The electrically conductive composite comprises an oxide-free metal. Preferably, the oxide-free metal is present in an amount of at least about 30% by volume, based on the total volume of the composite. The metal component of the composite has the characteristics of the aforementioned conducting metal powder utilized in the conductive paste. Preferred embodiments of the conducting metal powder are identical to the preferred embodiments of the powdered metal of the abovediscussed electrically conductive paste.

More preferably, the oxide-free metal comprises at least about 40% by volume, based on the total volume of the electrically conductive composite.

The second component of the electrically conductive composite is a thermoplastic polymer. The thermoplastic polymer utilized in the conductive composite is identical to the thermoplastic component of the electrically conductive paste. The thermoplastic polymer of the composite has the characteristics of the thermoplastic polymer of the conductive paste including the preferred embodiments thereof.

The electrically conductive composite of the present invention is formed from the electrically conductive paste of the present invention by subjecting the paste to heat. Bonding pressure may be provided, simultaneously with the application of heat, to improve or facilitate the bonding of the electrical components. Specifically, electrically conductive paste is dispensed between or among electrically conductive leads of two or more electrical components. The temperature of the paste is raised to a temperature in excess of the boiling temperature of the solvent to drive it out of the paste. It should be appreciated that the pressure need not necessarily be atmospheric. A vacuum may be imposed to lower the boiling point of the solvent.

In an alternate embodiment, the step of removing the solvent, in the process of converting the electrically conductive paste to a composite, involves dynamic gas exchange. This method, known to those skilled in the art, permits removal of solvent by evaporation at atmospheric pressure below its boiling point. This process usually takes place under a stream of nitrogen or other inert gas.

The process of forming an electrically conducting interconnect can be accomplished by either of two bonding processes. In the first, the paste is dispensed, followed by the application of pressure at a temperature above the glass transition temperature of the thermoplastic polymer. In this first process, the solvent evaporates, the thermoplastic polymer flows and forms an electrically conductive bond. In the second process, the paste is first dried (i.e., the solvent is removed) at a temperature below the glass transition point of thermoplastic polymer. Then, the transformation into the electrically conductive composite is completed by raising the temperature above the glass transition temperature of the thermoplastic polymer. This process, as suggested above, is a function of time and temperature. Obviously, the higher the bonding temperature, i.e., the temperature to which the paste is exposed, the shorter the time required. The optimum bonding conditions depend upon the particular structure to be formed as well as the glass transition temperature of the thermoplastic polymer.

The electrically conductive composite may comprise one or more optional components. These optional components may include, for example, corrosion inhibitors, surfactants and the like. The electrical conductive composite, which is formed from the electrical conductive paste of the present invention, like the paste, does not include a fluxing agent.

The criteria to select the formulation is based on balancing (i) the conductive properties of the polymer/metal composite; (ii) the Theological behavior of the polymer/metal/solvent paste; and (iii) the wetting and adhesion characteristics of the polymer on the filler metal and other substrates as a function of the intended application.

As to conductivity, ionic impurities acting as 'electron traps' during metal/insulator/metal tunneling should be low enough to maintain linear current (I) versus voltage drop (V) behavior in the current range prescribed by the intended application. Also, the conductivity ($\sigma$) versus temperature (T) should behave metal-like rather than that observed in disordered systems where the conductivity decreases with temperature, i.e., should follow the log $\sigma \sim T^{-\frac{1}{4}}$ law. And, lastly, the resistivity at liquid Helium temperatures should be as low as possible. For good adhesion, the polymer should wet the metal filler, should wet the substrate materials prescribed by the intended application and the Young's modulus of the polymer should preferable be above 0.1 GPa at 25° C. The paste should be compounded such that in terms of its rehological behavior its non-Newtonian viscosity is in the range of from about 3000–5000 Poise and the first normal stress difference should be as low as possible, indicating low elastic recoil. Further, the paste should exhibit a decrease in viscosity when subjected to a shearing process in contrast to ordinary visco-elastic and non-Newtonian fluids that exhibit stable viscosity.

Another aspect of the present invention is directed to processes involving the use of the novel conductive paste in the preparation of electrical components and devices wherein the paste is converted into the composite of the present invention. One such process involves the bonding of at least one flexible electrical component substrate to an electrical component. Such bonding, utilizing the electrical conductive paste of the present invention, results in an electrical assembly on a flexible substrate to create a flexible, that is, a "flex," circuit.

In this process the electrically conductive paste of the present invention is provided between a conductive surface of a circuitized flexible substrate and a conductive surface of an electrical component. The thus disposed paste is thereupon subjected to heat and pressure for a time sufficient to convert the conductive paste to the conductive composite and to form a bond. Preferably, the paste is heated to a temperature above the glass transition temperature of the polymer under a pressure of at least about 5 psi.

The resultant product provides electrical communication between the flexible substrate and the electrical component to produce a flexible circuit.

A second application of the electrically conductive paste and composite of the present invention is its use in a process of making a so-called "via to via" interconnect for multi-layered structures. This process is demonstrated by FIG. 1. A layer, shown generally at 10, includes a via 8 which is copper plated as shown at 6. The layer 10 includes a metal line in the x-direction, denoted by reference numeral 4, and metal lines in the y-direction, seen at 5. The layer 10 is provided with a ground plane 3 surrounded by a dielectric layer 2. The layer 10 further includes an adhesive surface 7.

Layer 10 is electrically interconnected with second layer 50 by means of the electrically conductive paste of the present invention. Specifically, dollops 12 of the conductive paste are disposed in the via 8 such that they extend above the top and below the bottom surfaces, which surfaces comprise an adhesive dielectric, as illustrated at 7. To electrically connect layer 10 to 50, that layer is similarly filled with dollops of conductive paste disposed in one or more vias included therein followed by the aforementioned drying process and thereafter the layers are aligned and pressed together under appropriate pressure and the temperature raised above the glass transition temperature of the polymer such that paste in the vias of the layers connect and fuse to form an electrically conductive composite.

Figure 2:
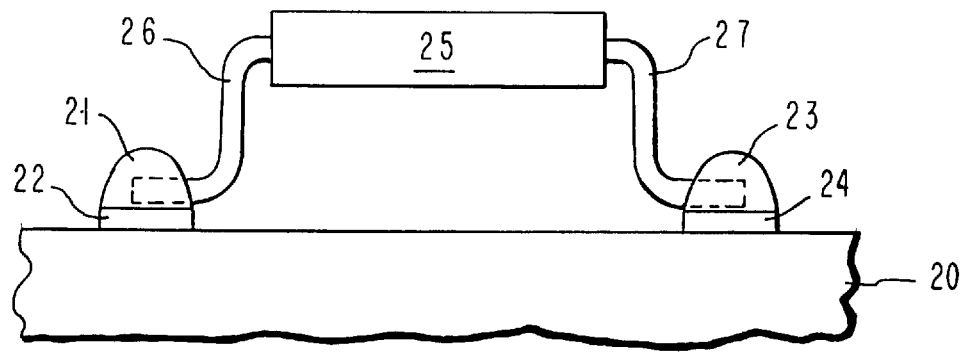
FIG. 2 is a schematic representation illustrating the use of the conductive paste and composite of the present invention to provide surface mounting of an integrated circuit chip in a lead-frame to a circuit board.

Another important utility of the conductive paste and composite of the present invention is in a process for the fabrication of surface mounts. This use of the electrically conductive paste and composite is illustrated in FIG. 2. In FIG. 2 an insulated substrate circuit board 20, which may be an organic polymer, a ceramic or the like, is provided with a plurality of terminal points, known in the art as pads. This is illustrated in FIG, 2 by pads 22 and 24. The pads 22 and 24 are in electrical communication with an integrated circuit chip in a lead frame 25 by means of electrical conduits 26 and 27, thus providing electrical communication between the substrate board 20 and the integrated circuit chip 25. This communication is made permanent by means of the electrically conductive paste of the present invention. As depicted in FIG. 2, dollops of paste 21 and 23 disposed between leads to electrical conduits 26 and 27 and pads 22 and 24, respectively, are subjected to elevated temperature above the glass transition temperature of the polymer and sufficient load, preferably at least equal to the combined weight of the chip 25 and the conduits 26 and 27, to form the composite of the present invention.

Yet another application of the electrically conductive paste and composite of the present invention is in a process which results in a "flip chip" attachment such as is described in U.S. Pat. No. 4,434,434 which is incorporated herein by reference. Such attachments represent a major advance in computer technology. A "flip chip" attachment permits the bonding of an integrated circuit chip directly to a circuit board by means other than wiring therebetween. The use of the electrically conductive paste thus represents a major advance in fabrication of computer and other sophisticated electronic devices in that wiring is highly labor intensive, space consuming and thus expensive and time consuming.

Figure 3:
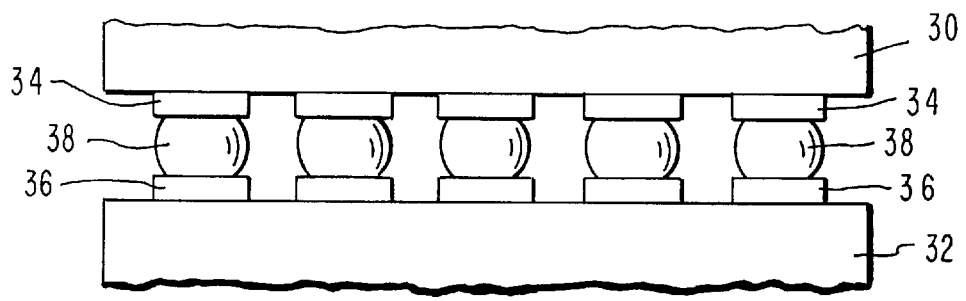
FIG. 3 is a schematic representation of a "flip-chip" attachment between an integrated circuit chip and a circuit board utilizing the electrically conductive paste and composite of the present invention to provide attachment and electrical communication between the two elements.

In the process of the present invention flip chip attachment is accomplished by employing the conductive paste of the present invention. This process is best explained by reference to FIG. 3 wherein a sketch of this attachment is illustrated. A chip 30 is "flipped," that is, turned upside down, so that the pads 34 on its surface are aligned with the pads 36 of a circuit board 32 (also referred to sometimes as a substrate). Small amounts of the electrically conductive paste 38 are disposed between the pads 34 and the pads 36 such that there is electrical communication therebetween. The whole arrangement is thereupon subjected to elevated temperature and pressure, preferably at least about 5 psi, to convert the paste to the electrically conductive composite of the present invention to make this electrical communication permanent.

Alternatively, the flip chip process may involve deposition of the paste on the pads of the substrate or the pads of the chip or both. Subsequently, the paste is dried then the two surfaces are aligned and bonded under pressure at a temperature above the glass transition point of the thermoplastic polymer to produce the desired electrically connected device in a rapid and substantially defect-free manner.

The above applications emphasize the advance in the art associated with the paste and composite of the present invention. The unique combination of components that constitute the paste composition permit the easy conversion to a permanent composite which electrically connects electrical and electronic devices under relatively mild conditions of temperature and pressure without attendant damage to the electrical and electronic devices. It is furthermore emphasized that although formation of the composite makes "permanent" electrical connections, these connections can be easily disconnected by the imposition of a temperature in excess of the glass transition temperature of the thermoplastic component of the composition without damage to the components connected by the composite.

The following examples are given to illustrate the scope of the present invention. Because these examples are given for illustrative purposes only, the invention should not be deemed limited thereto.

EXAMPLE 1

A solution of poly(imide siloxane) in acetophenone was prepared wherein the poly(imide siloxane) represented 28% by weight, based on the total weight of the solution. To this solution flakes of silver metal of varying particle size of about 1 to 5 microns in the length and width dimensions and about 1 μm thick were added. The silver particles were present in a concentration of 87% by weight, based on the total weight of the silver and poly(imide siloxane). The 87% by weight concentration was calculated independent of the weight of the acetophenone solvent.

The resultant dispersion of silver particles in the poly (imide siloxane)-acetophenone solution was formed into a paste by mixing the dispersion under high shear in a Mueller [trademark] high shear mixer.

In a flip chip attach (FCA) application of the above mentioned paste composition, the paste was dispensed as 100 μm diameter circles of about 100 μm height at 200 μm center-to-center onto a substrate coated with Au. The array of the features was 11 times 11. The resultant array of circles was joined to another Au coated substrate at a bonding load of 2.5 lbs. at 340° C. The total resistance for the structure was $\leq 1$ μΩ-cm$^2$. The resultant adhesion strength of the 11 times 11 array was 3000 psi.

EXAMPLE 2

A 28% by weight solution of poly(imide siloxane) in N-methyl pyrrolidinone (NMP), similar to that prepared in Example 1 but for the identity of the solvent, was combined with gold particles having a particle size of 1 to 5 microns. The quantity of gold particles added to the poly(imide siloxane) solution was such that the gold particles represented 92% by weight, based on the total weight of the gold and poly(imide siloxane). This percentage was independent of the weight of the NMP solvent.

As in Example 1, this dispersion of gold in the poly(imide siloxane)-NMP solution was converted into a paste after being subjected to mixing in a Mueller [trademark] high shear mixer.

This paste was used in the same FCA application as described in Example 1. The adhesion strength was 3200 psi for a bonding load of 2.75 lbs.

EXAMPLE 3

A mixture comprising 13% by weight of poly(imide siloxane), 68% by weight of Ag flakes of varying sizes (3–10 μm) in length and width dimensions and about 1 μm thick and 19% by weight of acetophenone was compounded in a high-shear mixture to form a paste. The paste was dispensed onto Cu pads that had been cleaned of surface oxide, on an epoxy board as an example of a surface mount application such as shown in FIG. 2. The paste was dispensed on 28 patterns of 1.65 square millimeter rectangles with a pitch of 1.27 mm divided into two rows of 14 pads. A VSOP (Very Small Outline Package) of 28 lead pins was attached to the wet paste. The part was dried and then cured at 220° C. for 10 mins. The resultant adhesion of the component to the board was 0.6 lbs. per lead.

Having thus described the invention, what is claimed as new and what is desired to be secured by Letters Patent is:

1. A paste for forming an electrically conductive composite comprising, in the absence of a flux agent, a thermoplastic polymer selected from the group consisting of a poly (imide urea), a poly(ether siloxane), a poly(styrene butadiene), a poly styrene isoprene), a poly(acrylonitrile butadiene), a poly(ethylene vinyl acetate) and a polyurethane; an oxide-free metal powder having a melting point of at least about 200° C., wherein said oxide-free powder is an oxide-free elemental metal or an alloy of at least two oxide-free elemental metals; and an organic solvent system which includes at least one polar organic solvent selected from the group consisting of an ester, an ether an amide, a lactone and a sulfone; and solvent selected from the group consisting of a second organic a non-polar solvent wherein said thermoplastic polymer, oxide-free metal powder and organic solvent system are compounded such that the paste has a non-Newtonian viscosity in the range of from about 3000–5000 Poise.

2. A paste in accordance with claim 1 wherein said elemental metal is selected from the group consisting of gold, silver, tin, nickel, ruthenium, rhodium, palladium, platinum and iridium.

3. A paste in accordance with claim 1 wherein said polar organic solvent is selected from the group consisting of dimethyl adipate, ethyl benzoate, acetophenone, 2-methoxyethyl ether, dimethyl acetamide, N- methyl pyrrolidinone, dimethyl sulfoxide and mixtures thereof.

4. A paste in accordance with claim 1 wherein said non-polar solvent is selected from the group consisting of xylene and trimethylbenzene.

* * * * *